United States Patent
Haga et al.

(10) Patent No.: US 10,090,229 B2
(45) Date of Patent: Oct. 2, 2018

(54) SEMICONDUCTOR DEVICE AND METHOD FOR MANUFACTURING THE SAME

(71) Applicant: ROHM CO., LTD., Kyoto (JP)

(72) Inventors: Motoharu Haga, Kyoto (JP); Yosui Futamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/479,914

(22) Filed: Apr. 5, 2017

(65) Prior Publication Data
US 2017/0301612 A1    Oct. 19, 2017

(30) Foreign Application Priority Data
Apr. 14, 2016 (JP) .................. 2016-081468

(51) Int. Cl.
| H01L 23/495 | (2006.01) |
| H01L 21/48 | (2006.01) |
| H01L 21/56 | (2006.01) |
| H01L 23/31 | (2006.01) |
| H01L 23/00 | (2006.01) |

(52) U.S. Cl.
CPC .... *H01L 23/49548* (2013.01); *H01L 21/4825* (2013.01); *H01L 21/565* (2013.01); *H01L 23/3114* (2013.01); *H01L 23/4952* (2013.01); *H01L 23/49513* (2013.01); *H01L 23/49575* (2013.01); *H01L 23/49582* (2013.01); *H01L 24/27* (2013.01); *H01L 24/32* (2013.01); *H01L 24/48* (2013.01); *H01L 24/73* (2013.01); *H01L 2224/27462* (2013.01); *H01L 2224/27472* (2013.01); *H01L 2224/32245* (2013.01); *H01L 2224/48245* (2013.01); *H01L 2224/73265* (2013.01)

(58) Field of Classification Search
CPC ......... H01L 23/49548; H01L 23/49575; H01L 23/49513; H01L 23/49582
USPC .................................................. 257/666, 676
See application file for complete search history.

(56) References Cited

U.S. PATENT DOCUMENTS

| 5,245,215 | A | | 9/1993 | Sawaya | |
| 5,352,632 | A | | 10/1994 | Sawaya | |
| 6,034,422 | A | * | 3/2000 | Horita | H01L 23/49582 257/666 |
| 6,396,129 | B1 | * | 5/2002 | Hung | H01L 23/49503 257/666 |
| 7,507,603 | B1 | * | 3/2009 | Berry | H01L 21/561 257/E21.599 |
| 7,687,893 | B2 | * | 3/2010 | Smith | H01L 23/4951 257/676 |

(Continued)

FOREIGN PATENT DOCUMENTS

JP    H06-061406 A    3/1994

*Primary Examiner* — Nitin Parekh
(74) *Attorney, Agent, or Firm* — Rabin & Berdo, P.C.

(57) ABSTRACT

A semiconductor device includes a plurality of islands, each having an outer surface including an upper surface and end surfaces, semiconductor chips, above the respective islands, a bonding material, between the islands and the semiconductor chips, and plating layers, formed on the outer surfaces of the islands, and with at least one of the plurality of islands, the island is exposed as a bare surface region at a first end surface, which, among the end surfaces of the one island, faces the island adjacent thereto.

15 Claims, 13 Drawing Sheets

(56) References Cited

U.S. PATENT DOCUMENTS

| | | | | |
|---|---|---|---|---|
| 7,732,899 | B1 * | 6/2010 | Berry | H01L 21/561 257/666 |
| 8,063,470 | B1 * | 11/2011 | Sirinorakul | H01L 21/4832 257/666 |
| 8,551,820 | B1 * | 10/2013 | Foster | H01L 24/97 257/666 |
| 8,810,015 | B2 * | 8/2014 | Camacho | H01L 21/565 257/676 |
| 9,012,268 | B2 * | 4/2015 | Jaurigue | H01L 24/96 257/666 |
| 2008/0157311 | A1 * | 7/2008 | Smith | H01L 23/4951 257/678 |
| 2011/0291251 | A1 * | 12/2011 | Camacho | H01L 21/4832 257/676 |
| 2015/0001698 | A1 * | 1/2015 | Jaurigue | H01L 24/96 257/676 |
| 2015/0076675 | A1 * | 3/2015 | Real | H01L 23/49548 257/676 |
| 2016/0293817 | A1 * | 10/2016 | Oda | H01L 24/97 |

* cited by examiner

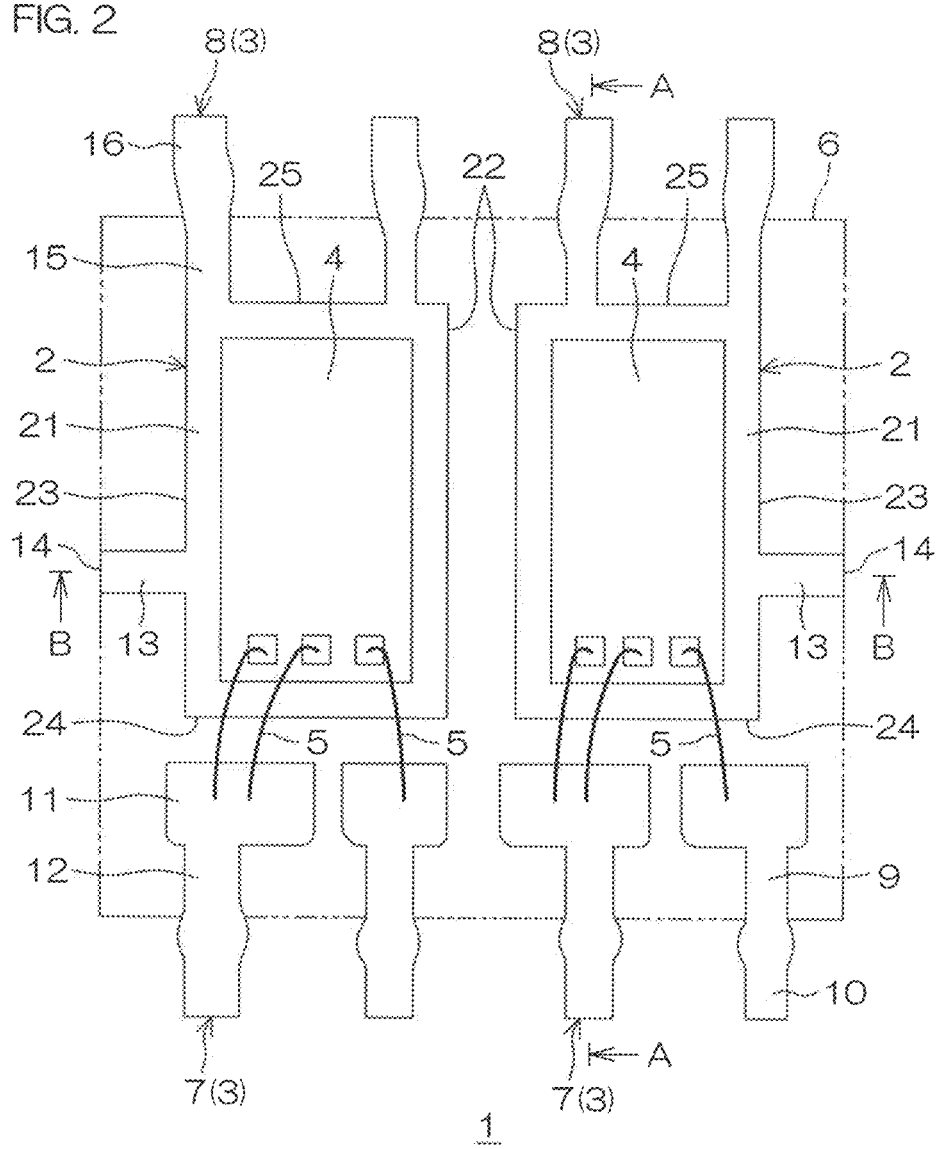

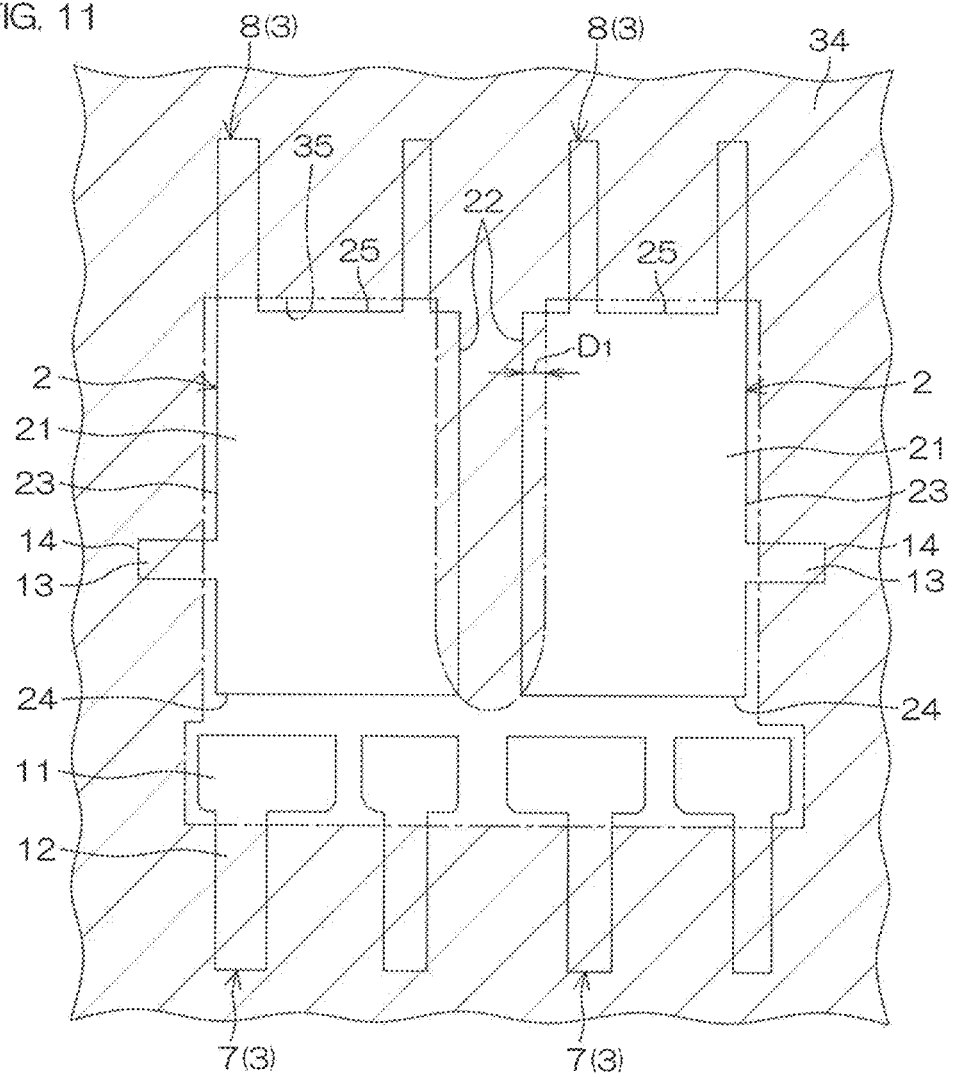

Silver plating is wetted.   Silver plating is wetted.

FIG. 15A   Solder bridge is present.
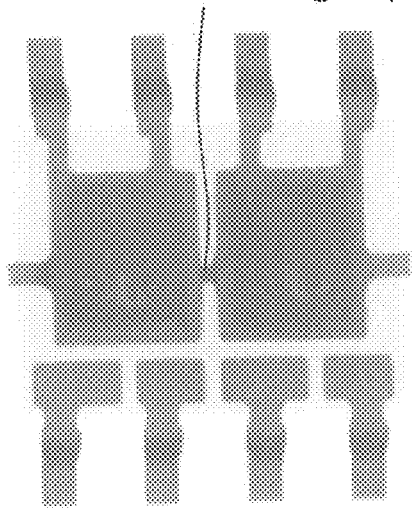
FIG. 15B   Solder bridge is present.
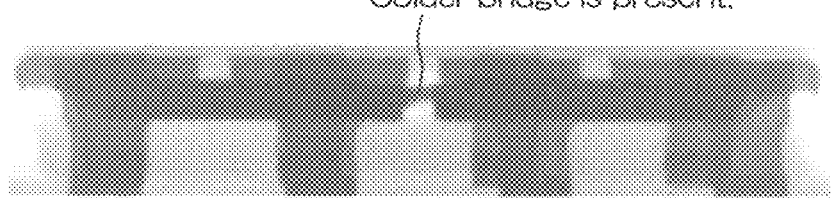
FIG. 16   No solder bridge
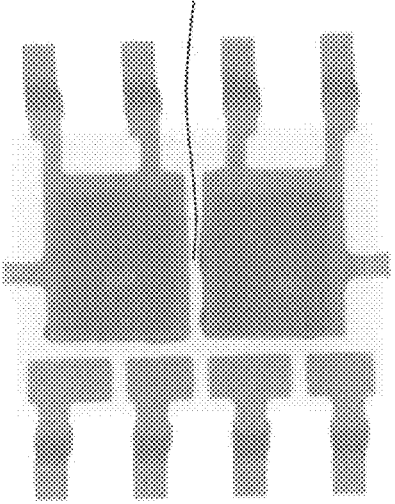

SEMICONDUCTOR DEVICE AND METHOD FOR MANUFACTURING THE SAME

CROSS-REFERENCE TO RELATED APPLICATIONS

The present application corresponds to Japanese Patent Application No. 2016-81468 filed in the Japan Patent Office on Apr. 14, 2016, and the entire disclosure of this application is incorporated herein by reference.

TECHNICAL FIELD

The present invention relates to a semiconductor device and a method for manufacturing the same.

BACKGROUND ART

For example, Patent Document 1 (Japanese Patent Application Publication No. 6-61406) discloses a semiconductor device, including a plurality of islands, a plurality of semiconductor chips, mounted above the respective islands using an Ag-based material, etc., and a resin package that collectively seals the plurality of islands and plurality of semiconductor chips.

SUMMARY OF INVENTION

When a plurality of semiconductor chips are mounted in a single resin package as in Patent Document 1, there is a problem of short-circuiting between the chips. For example, a bonding material bonding a semiconductor chip and an island may bridge over to an adjacent island and make the islands mutually conductive.

A preferred embodiment of the present invention thus provides a semiconductor device, which enables prevention of bridging of a bonding material between adjacent islands, and a method for manufacturing the semiconductor device.

A semiconductor device according to a preferred embodiment of the present invention includes a plurality of islands, each having an outer surface including an upper surface and end surfaces, semiconductor chips, above the respective islands, a bonding material, between the islands and the semiconductor chips, and plating layers, formed on the outer surfaces of the islands, and with at least one of the plurality of islands, the island is exposed as a bare surface region at a first end surface, which, among the end surfaces of the one island, faces the island adjacent thereto.

A method for manufacturing a semiconductor device according to a preferred embodiment of the present invention includes a process of preparing a lead frame, having a plurality of islands, each having an outer surface including an upper surface and end surfaces, and leads at peripheries of the plurality of islands, a process of forming, on at least one of the plurality of islands, a mask at a peripheral edge portion at a side of a first end surface, which, among the end surfaces of the one island, faces the island adjacent thereto, a process of forming plating layers on the upper surfaces of the islands with the mask remaining, and a process of installing semiconductor chips via a bonding material above the plating layers.

Advantageous Effects of Invention

With the preferred embodiment of the present invention, the plating layer is formed in the state where the peripheral edge portion at the first end surface side of the island is masked and therefore at least the forming of the plating layer on the first end surface of the island can be prevented. By the above, even when the bonding material wet-spreads to a region above the plating layer, it can be prevented from wet-spreading to the first end surface. Consequently, bridging over of the bonding material to an adjacent island can be prevented. Short-circuiting between islands can thus be prevented and a semiconductor device of high reliability can be realized.

BRIEF DESCRIPTION OF DRAWINGS

FIG. 2 is a schematic plan view of the semiconductor device.

FIG. 11 is a diagram of a mask pattern for plating used in the manufacturing process of the semiconductor device.

FIG. 15A is an X-ray image (plan view) of the semiconductor device according to the comparative example.

FIG. 15B is an X-ray image (side view) of the semiconductor device according to the comparative example.

FIG. 16 is an X-ray image (plan view) of the semiconductor device according to the example.

DESCRIPTION OF EMBODIMENTS

A preferred embodiment of the present invention shall now be described with reference to the attached drawings.

Figure 1:
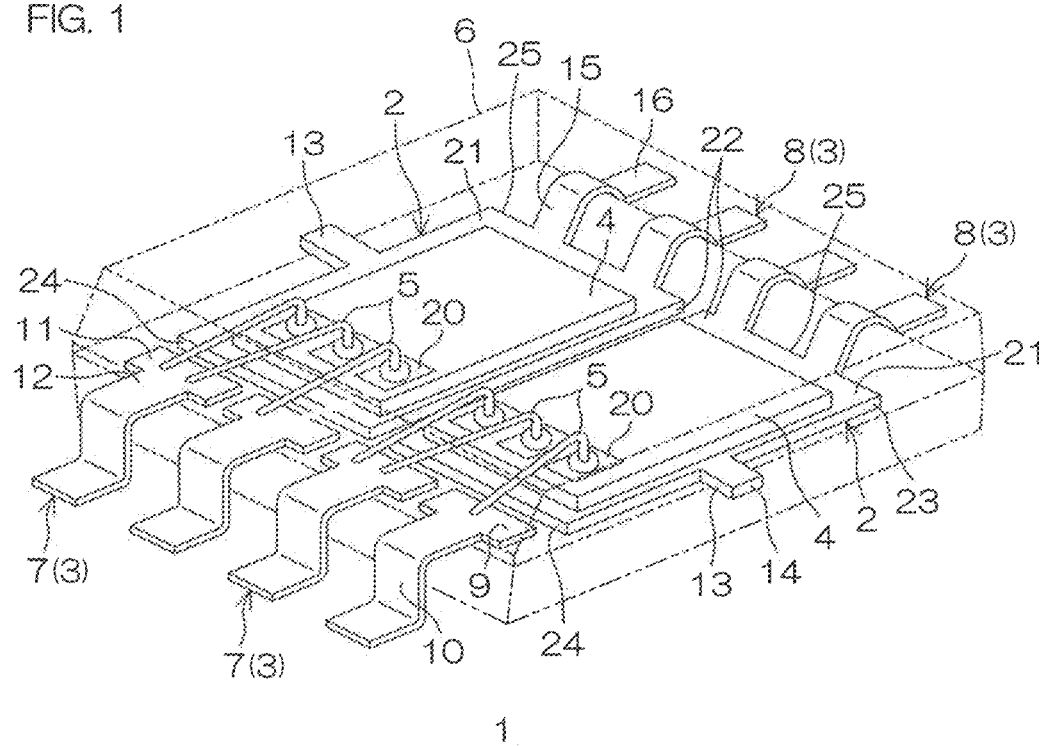
FIG. 1 is a perspective view of a semiconductor device according to a preferred embodiment of the present invention.
Figure 3A:
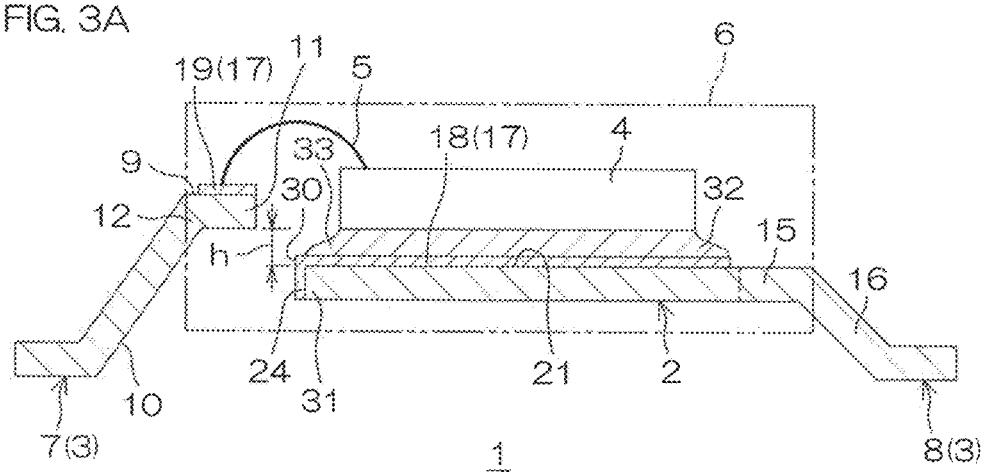
FIG. 3A and FIG. 3B are sectional views taken along section plane A-A and section plane B-B, respectively, of FIG. 2.
Figure 3B:
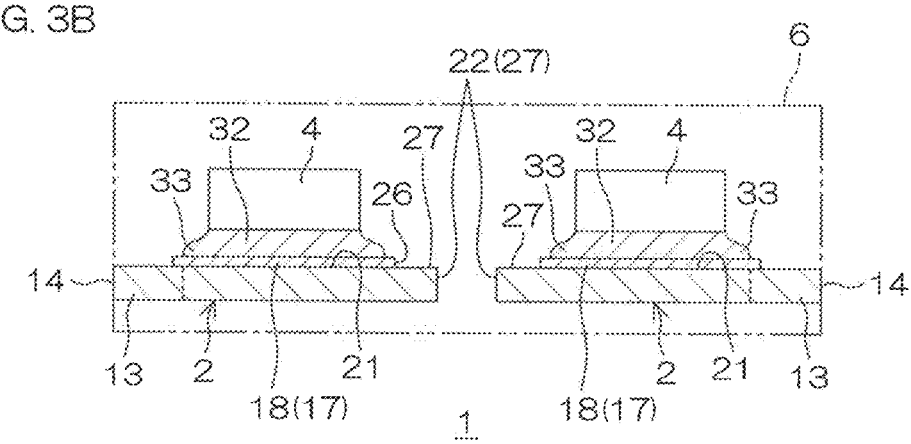
Figure 4:
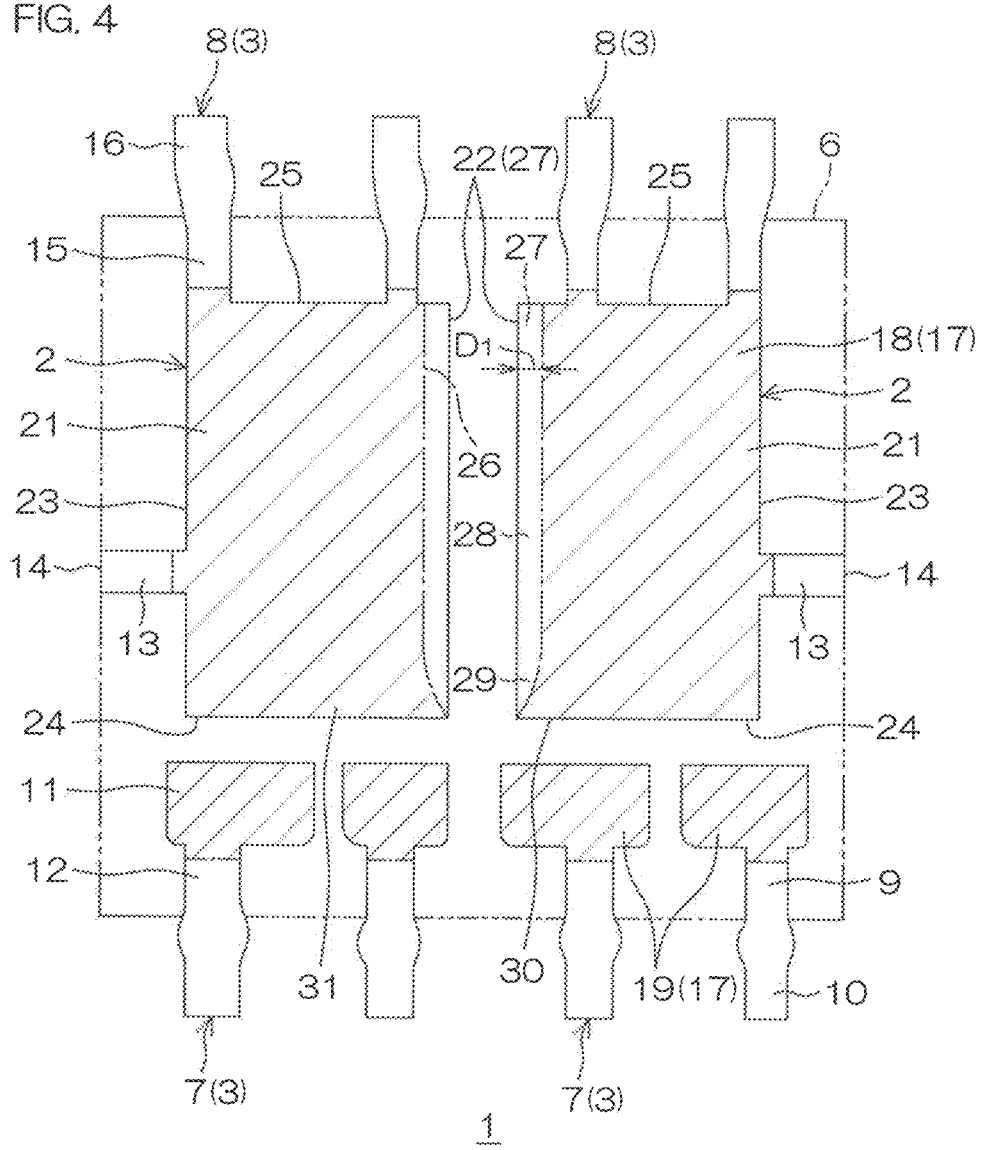
FIG. 4 is a diagram of a pattern of a plating region in the semiconductor device.

FIG. 1 is a perspective view of a semiconductor device 1 according to a preferred embodiment of the present invention. FIG. 2 is a schematic plan view of the semiconductor device 1. FIG. 3A and FIG. 3B are sectional views taken along section plane A-A and section plane B-B, respectively, of FIG. 2. FIG. 4 is a diagram of a pattern of a plating film 17 in the semiconductor device 1. In FIG. 4, semiconductor chips 4 and wires 5 are omitted for the sake of clarity.

The semiconductor device 1 is a semiconductor device to which an SOP (Small Outline Package) is applied. The semiconductor device 1 includes a plurality of islands 2, a plurality of leads 3, semiconductor chips 4, wires 5, and a resin package 6. The plurality of islands 2, the plurality of leads 3, the semiconductor chips 4, and the wires 5 are sealed collectively by the resin package 6 and an outer shape of the semiconductor device 1 (resin package 6) is a flat, rectangular parallelepiped shape. As the resin package 6, a known material, for example, epoxy resin, etc., may be applied.

The plurality of islands 2 are formed by punching out a metal thin plate (for example, a copper thin plate). In the present preferred embodiment, the plurality of islands 2 include two islands 2, which are adjacent to each other across an interval, for example, of 100 µm to 200 µm. Each island 2 is formed to an oblong shape in plan view and has an upper surface 21 and four end surfaces (side surfaces) 22, 23, 24, and 25.

Of the four end surfaces 22 to 25, the end surface 22 and the end surface 23 are in a mutually facing relationship, the end surface 24 and the end surface 25 are in a mutually facing relationship, and these respectively form pairs. The end surface 22 and the end surface 23, which form one pair, are, respectively, a facing end surface 22 (an example of a first end surface of the present invention), which faces an adjacent island 2, and an outer side end surface 23 (an example of a third end surface of the present invention), which faces an outer side at the opposite side. The end surface 24 and the end surface 25, which form the other pair, are a first lead side end surface 24 (an example of a second end surface of the present invention) and a second lead side end surface 25, respectively, at sides at which the plurality of leads 3 are disposed.

An island support portion 13 is connected integrally to the outer side end surface 23 of each island 2. The island support portion 13 extends rectilinearly outward from the outer side end surface 23 and is exposed from the resin package 6. In the present preferred embodiment, the island support portion 13 has a tip surface 14 that is flush with a side surface of the resin package 6 so as not to project from the resin package 6. Also, the island support portions 13 are provided at both of the mutually adjacent islands 2, and as shown in FIG. 2 and FIG. 4, one island support portion 13 and the other island support portion 13 extend along the same straight line.

As with the islands 2, the plurality of leads 3 are formed by punching out a metal thin plate (for example, a copper thin plate). The plurality of leads 3 include a plurality of first leads 7, disposed at the first lead end surface 24 side, and a plurality of second leads 8, disposed at the second lead end surface 25 side.

The plurality of first leads 7 are aligned at intervals along the first lead side end surfaces 24 of the islands 2, and the same number thereof is provided in each island 2. For example, in the present preferred embodiment, two each of the first leads 7 are provided for one island 2. Each first lead 7 is disposed across an interval from the islands 2 in a horizontal direction (direction parallel to the upper surfaces 21 of the islands 2) and with a height difference h in a vertical direction (direction normal to the upper surfaces 21 of the islands 2) as shown in FIG. 3A. Although in the present preferred embodiment, the respective first leads 7 are disposed at positions above the islands 2, the leads may be disposed at positions below the islands 2 instead. Obviously, the first leads 7 may be disposed at the same height position as the islands 2.

Also, each first lead 7 integrally includes an inner lead 9, sealed by the resin package 6, and an outer lead 10, exposed from the resin package 6.

The inner leads 9 are disposed in parallel to the upper surfaces 21 of the islands 2 at positions above the islands 2 and each integrally has a land portion 11, to which a wire 5 is connected, and an extension portion 12 as a terminal extending outward from the land portion 11. The land portion 11 is formed to be wider than the extension portion 12.

Each outer lead 10 is constituted entirely of an extending portion (with the same width as the extension portion 12) of the extension portion 12 of the inner lead 9 and is formed to a substantially cranked shape having a bent portion that is bent downward. The outer leads 10 function as external connection portions when the semiconductor device 1 is mounted on a printed wiring board.

The plurality of second leads 8 are aligned at intervals along the second lead side end surfaces 25 of the islands 2, and the same number thereof is provided in each island 2. For example, in the present preferred embodiment, two each of the second leads 8 are provided for one island 2. Each second lead 8 is arranged as an integral lead that is cantilevered by an island 2.

Also, each second lead 8 integrally includes an inner lead 15, sealed by the resin package 6, and an outer lead 16, exposed from the resin package 6.

The inner leads 15 extend outward from the second lead side end surfaces 25 of the islands 2 as terminals of substantially fixed width.

Each outer lead 16 is constituted entirely of an extending portion (with the same width as the inner lead 15) of the inner lead 15 and is formed to a substantially cranked shape having a bent portion that is bent downward. The outer leads 16 function as external connection portions when the semiconductor device 1 is mounted on a printed wiring board.

Plating films 17 are formed on the islands 2 and the plurality of leads 3. The plating films 17 are constituted, for example, of a metal material, such as Au, Ni, Ag, etc., and, in the present embodiment, Ag plating films are applied. Formation regions of the plating films 17 are shown more clearly in FIG. 4.

Referring to FIG. 4, the plating films 17 are the regions provided with hatching and are formed on substantially entireties of the islands 2, the land portions 11 and base end portions (boundary portions with respect to the land portions 11) of the extension portions 12 of the first leads 7, base end portions (boundary portions with respect to the islands 2) of the inner leads 15 of the second leads 8, and base end portions (boundary portions with respect to the islands 2) of the island support portions 13.

Each first plating film 18, as an example of a plating layer of the present invention, formed on an island 2, on the second leads 8 and on the island support portion 13 integral to the island 2, has a feature that, on the upper surface 21 of the island 2, a first outer edge 26 is set on a line separated by a predetermined distance $D_1$ (of, for example, 150 µm to 300 µm) from the facing end surface 22. A bare surface (that is, a Cu portion) of the island 2 is thereby exposed as a bare surface region 27 at the facing end surface 22 of the island 2 and between the facing end surface 22 and the first outer edge 26 of the first plating film 18.

Each bare surface region 27 includes, at the upper surface 21 of the corresponding island 2, a rectilinear portion 28, which is of fixed width and is parallel to the facing end surface 22 of the island 2, and a non-rectilinear portion 29, which is continuous with an end portion at the first lead 7 side of the rectilinear portion 28 and narrows in width at a corner portion of the island 2. An end portion at the second lead 8 side of rectilinear portion 28 may reach the second lead side end surface 25 in the fixed width state. Also, although the non-rectilinear portion 29 is not particularly restricted in shape, it is demarcated, in the present preferred embodiment, by the first outer edge 26 of the first plating film 18 being formed in an arch that is curved toward an inner side of the island 2. The first plating film 18 is thereby increased gradually in width at the first lead 7 side.

Also, as another feature of the first plating film 18, a second outer edge 30 is set, at the upper surface 21 of the island 2, on a line matching the first lead side end surface 24. A peripheral edge portion 31 at the first lead 7 side of the upper surface 21 of the island 2 is thereby covered by the first plating film 18. Further with the present preferred embodiment, the first plating film 18 also covers the first lead side end surface 24.

To summarize the above, in regard to each island 2, the facing end surface 22 is not covered by the plating film 17 (that is, the bare surface of the island 2 is exposed) and the first lead side end surface 24 is covered by the plating film 17. The remaining outer side end surface 23 and the second lead side end surface 25 may be covered or do not have to be covered by the plating film 17.

That is, if the facing end surface 22 is covered by the plating film 17, a bonding material 32 (to be described below) may wet-spread to the facing end surface 22 and this is not preferable as it may cause the bonding material 32 to bridge over to the adjacent island 2. On the other hand, the first lead side end surface 24 is provided with the height difference h (see FIG. 3A) with respect to the adjacent first leads 7. Therefore, even if the bonding material 32 wet-spreads due to the plating film 17 covering, a possibility of the bonding material 32 bridging over to the first leads 7 is low and does not present much of a problem. Similarly in regard to the outer side end surface 23 and the second lead side end surface 25, the conductive members adjacent to these end surfaces 23 and 25 are the island support portion 13 and the second leads 8 and since these are all connected directly to the island 2, a short-circuit problem will not occur even if these members 8 and 13 contact the bonding material 32. The outer side end surface 23 and the second lead side end surface 25 may thus be covered by the plating film 17.

Each second plating film 19, as an example of a second plating layer of the present invention formed on a first lead 7, covers, for example, an entirety of the land portion 11 of the first lead 7. Although in the present preferred embodiment, end surfaces of the land portion 11 is not covered by the second plating film 19, based on the principle of formation of a bridge of the bonding material 32 described above, there is no problem in particular even if the end surfaces of the land portion 11 are covered by the second plating film 19.

Each semiconductor chip 4 is formed to a quadrilateral shape in plan view and has a plurality of pads 20 at peripheral edge portions of an upper surface. The plurality of pads 20 are aligned at equal intervals along one peripheral edge of the semiconductor chip 4. The semiconductor chip 4, in an orientation where the upper surface, at which the pads 20 are disposed, is faced upward, is bonded via the bonding material 32 to the corresponding island 2. Also, the plurality of semiconductor chips 4 may be elements having mutually the same function (for example, both may be a MOSFET, etc.).

For example, a solder paste is used as the bonding material 32. The plating film 17 is formed over an area wider than the semiconductor chip 4 in plan view so as to surround the semiconductor chip 4, and therefore the bonding material 32 has a protruding portion 33 protruding outwardly from a region between the semiconductor chip 4 and the island 2. However, the plating film 17 has its first outer edge 26 set away from the facing end surface 22 and therefore does not wet-spread to the facing end surface 22 but stays within an inner region of the island 2.

Although in the present preferred embodiment, the wires 5 are constituted of so-called Cu wires having Cu as a main component (for example, with a purity of Cu being not less than 99.99%), Au wires or Al wires may be used as modification examples. The wires 5 connect the pads 20 of the semiconductor chip 4 and the first leads 7. Two wires 5 from two pads 20 may be connected to a single first lead 7 as shown in FIG. 1, or a single wire 5 from a single pad 20 may be connected to a single first lead 7.

FIG. 5 to FIG. 10 are diagrams showing portions of a manufacturing process of the semiconductor device 1 in the order of process. In each of FIG. 5 to FIG. 10, the drawings having "A" indicated alongside correspond to the section plane A-A of FIG. 2 and the drawings having "B" indicated alongside correspond to the section plane B-B of FIG. 2.

Figure 5A:
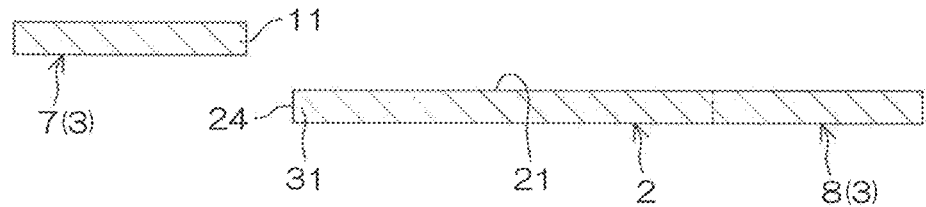
FIG. 5A and FIG. 5B are diagrams showing a portion of a manufacturing process of the semiconductor device and correspond to the section plane A-A and the section plane B-B, respectively, of FIG. 2.
Figure 5B:
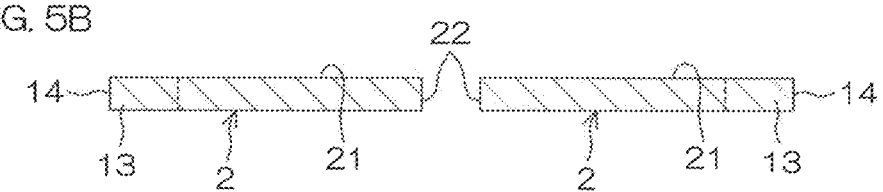

To manufacture the semiconductor device 1, for example, a lead frame, integrally having the islands 2 and the leads 3 is first prepared as shown in FIG. 5A and FIG. 5B.

Figure 6A:
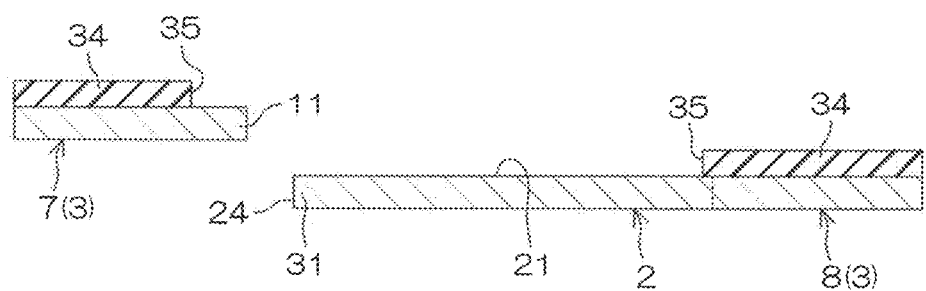
FIG. 6A and FIG. 6B are diagrams of a process subsequent to that of FIG. 5A and FIG. 5B.
Figure 6B:
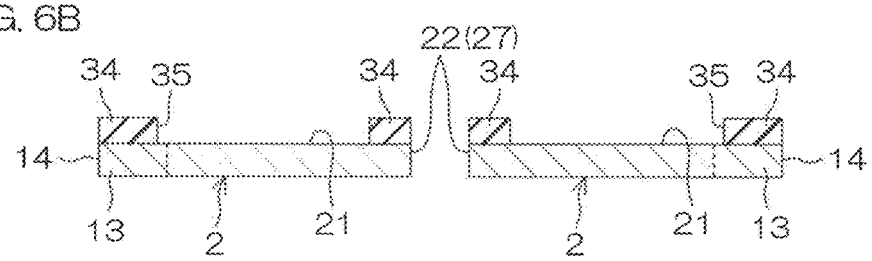

Next, as shown in FIG. 6A and FIG. 6B, a mask 34 is formed above the islands 2 and the leads 3. For example, a masking tape, such as a polyimide tape, etc., may be adhered as the mask 34. As shown in FIG. 11, the mask 34 has openings 35 at regions in which the plating films 17 described above are to be formed. In the present preferred embodiment, the islands 2 and the leads 3 are not covered individually and, for example, the mask 34 covers peripheral edge portions of respective facing end surfaces 22 of mutually adjacent islands 2 integrally so as to cross over the facing end surfaces 22.

Figure 7A:
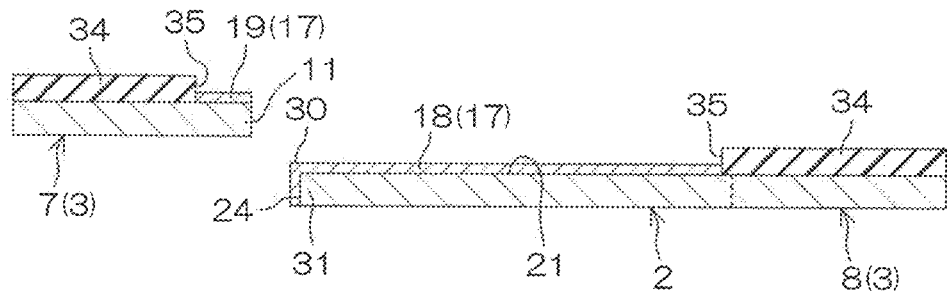
FIG. 7A and FIG. 7B are diagrams of a process subsequent to that of FIG. 6A and FIG. 6B.
Figure 7B:
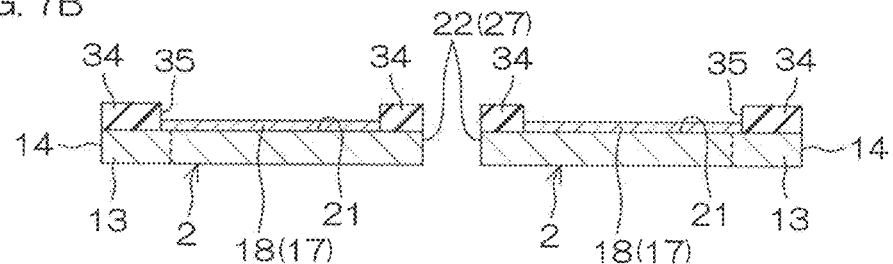

Next, as shown in FIG. 7A and FIG. 7B, the plating films 17 are formed on outer surfaces of the islands 2 and the leads 3 that are exposed from the openings 35 in the mask 34. For example, an electroplating method is applied as a plating method.

Figure 8A:
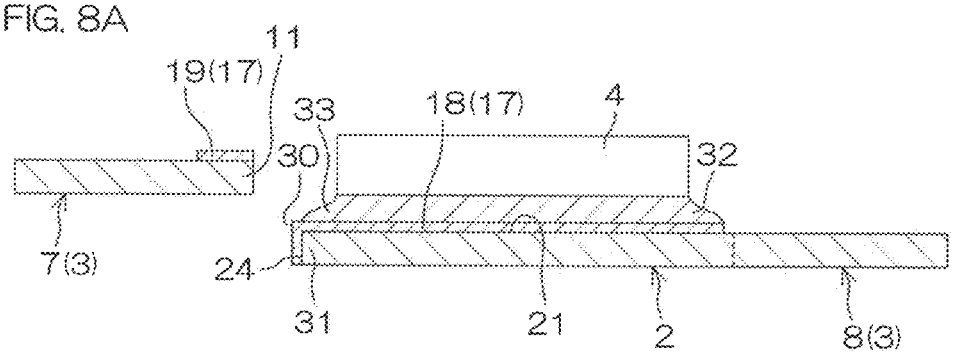
FIG. 8A and FIG. 8B are diagrams of a process subsequent to that of FIG. 7A and FIG. 7B.
Figure 8B:
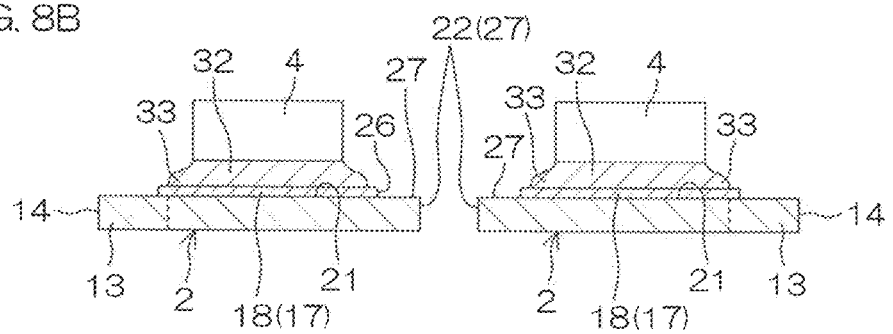

Next, as shown in FIG. 8A and FIG. 8B, the semiconductor chips 4 are die-bonded via the bonding material 32 to the islands 2.

Figure 9A:
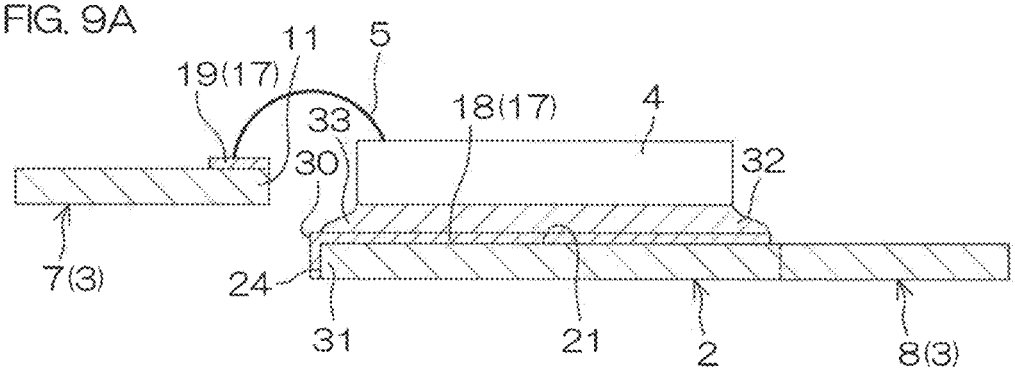
FIG. 9A and FIG. 9B are diagrams of a process subsequent to that of FIG. 8A and FIG. 8B.
Figure 9B:
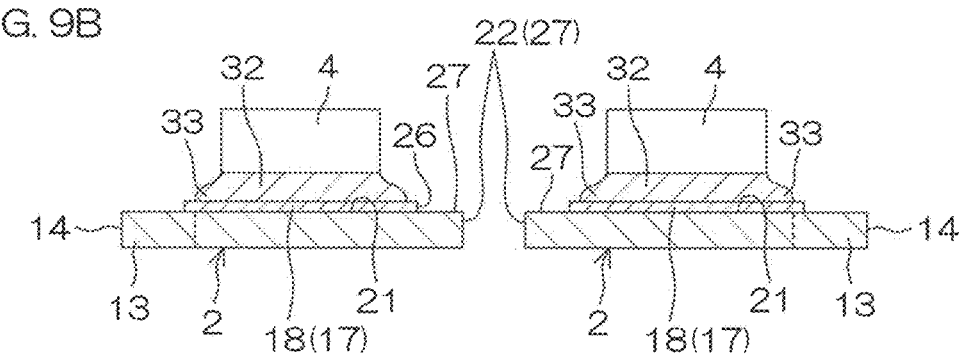

Next, as shown in FIG. 9A and FIG. 9B, the semiconductor chips 4 and the first leads 7 are connected by wires 5.

Figure 10A:
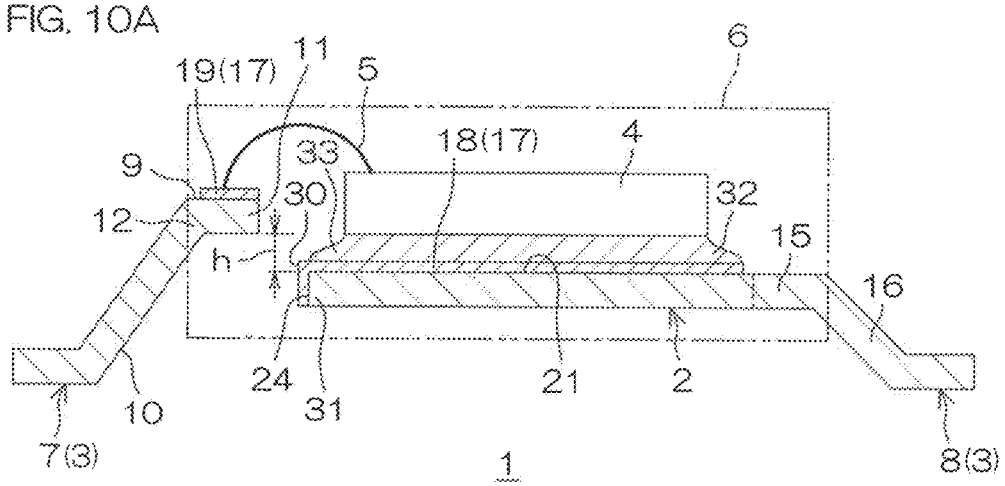
FIG. 10A and FIG. 10B are diagrams of a process subsequent to that of FIG. 9A and FIG. 9B.
Figure 10B:
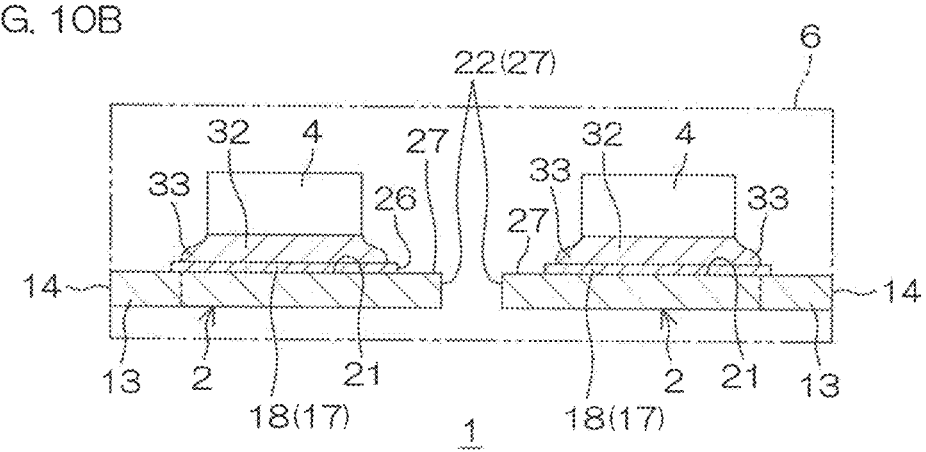

Next, as shown in FIG. 10A and FIG. 10B, the plurality of islands 2, the plurality of leads 3, the semiconductor chips 4, and the wires 5 are sealed collectively by the resin package 6. After sealing, cutting apart into the individual pieces of the respective semiconductor devices 1 is performed. Then by the outer leads 10 and 16 of the leads 3 being processed so as to be bent in cranked shapes, the semiconductor device 1 shown in FIG. 1 is obtained.

As described above, with the present preferred embodiment, the plating films 17 are formed in a state were the mask 34 is applied to the peripheral edge portions of the islands 2 up to positions separated by the predetermined distance $D_1$ from the facing end surfaces 22 of the islands 2 as shown in FIG. 11. Thereby in the islands 2 after plating, the bare surface regions 27 can be formed at the facing end surfaces 22 and at the facing end surface 22 side peripheral edge portions of the islands 2 as shown in FIG. 4. Therefore, even if, when bonding the semiconductor chips 4 onto the islands 2, the bonding material 32 spreads outward, the spreading of the bonding material 32 can be stopped at boundaries (first outer edges 26) between the bare surface regions 27 and the plating films 17. That is, the bonding material 32 can be prevented from wet-spreading to the facing end surfaces 22. Consequently, bridging of the bonding material 32 across adjacent islands 2 can be prevented. Short-circuiting between the islands 2 can thus be prevented and the semiconductor device 1 of high reliability can be realized.

Although a preferred embodiment of the present invention has been described above, the present invention may also be implemented in yet other modes.

For example, although in the preferred embodiment described above, the bare surface regions 27 are formed at both of the adjacent islands 2, a mode is also possible where a bare surface region is formed at just one of either of the adjacent islands. In this case, the plating film 17 may be formed on the facing end surface 22 of the other island 2. Even with such an arrangement, the bonding material 32 can be prevented at least from wet-spreading to the island 2 with which the bare surface region 27 is formed at the facing end surface 22 and therefore the above effect can be achieved.

Also, although an SOP type semiconductor device was taken up for the preferred embodiment described above, the present invention may also be applied to a semiconductor device of another package type, such as a QFP (Quad Flat Package), an SON (Small Outline Non-leaded package), or a QFN (Quad Flat Non-leaded package), etc.

The semiconductor device according to the present invention may be used generally in the manufacture of power devices, such as power modules, etc. and can be applied satisfactorily especially in fields in which compact size and lightweight are required and to devices used under environments of severe temperature change, such as devices for onboard use, solar cells, industrial equipment, etc.

Besides the above, various design modifications may be made within the scope of the matters described in the claims.

EXAMPLES

Although the present invention shall now be described based on an example and a comparative example, the present invention is not restricted by the example described below.

Example

Figure 12A:
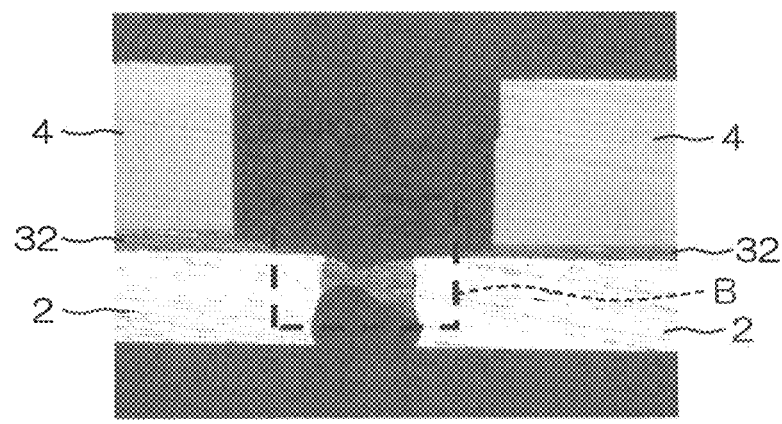
FIG. 12A is an image of a principal portion of a semiconductor device according to a comparative example.
Figure 12B:
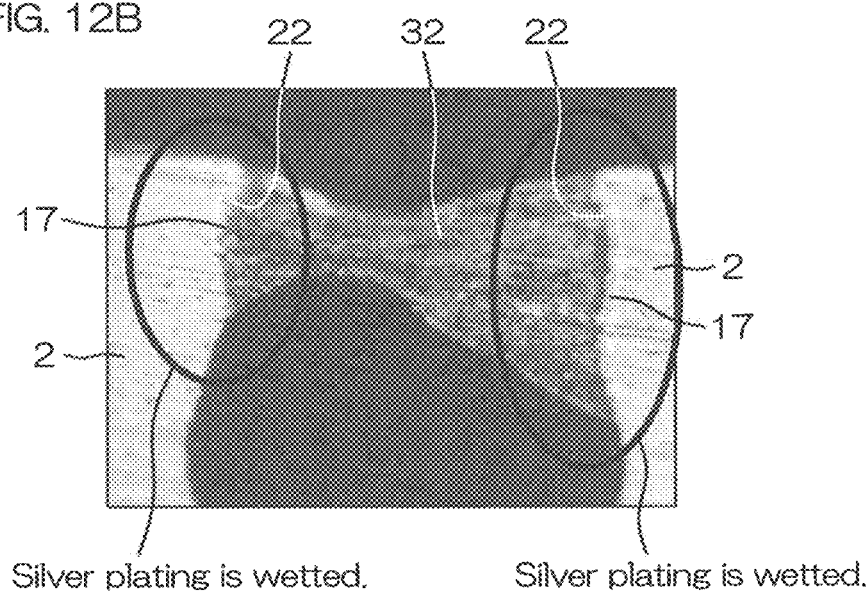
FIG. 12B is an enlarged view of a region surrounded by broken lines B in FIG. 12A.
Figure 13A:
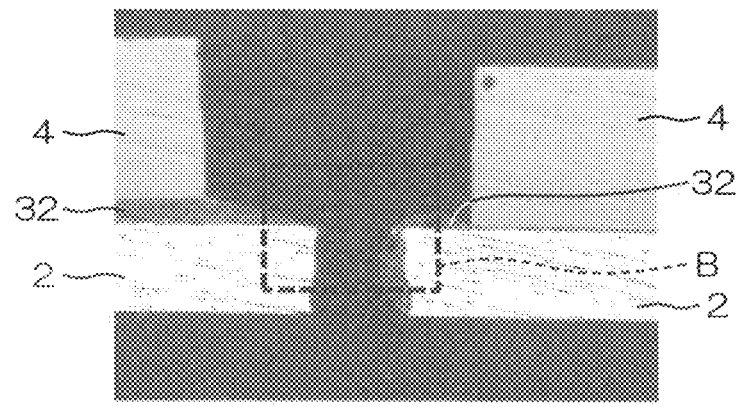
FIG. 13A is an image of a principal portion of a semiconductor device according to an example.
Figure 13B:
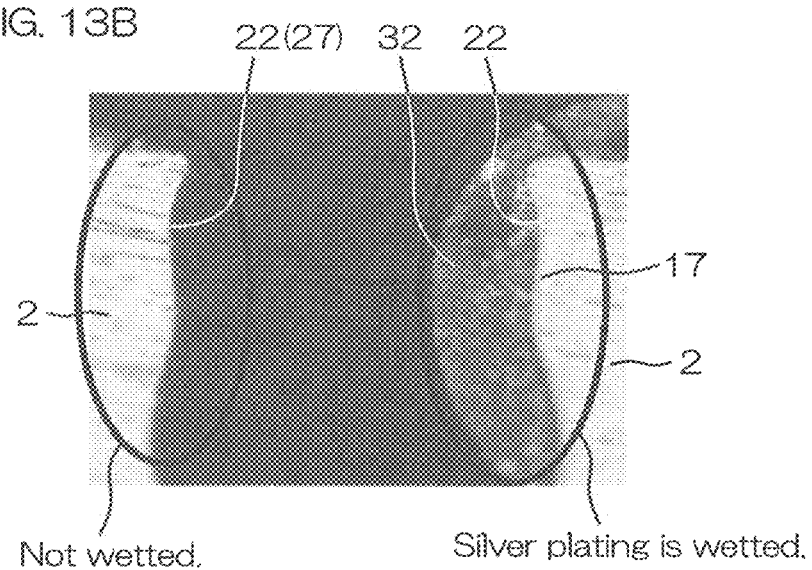
FIG. 13B is an enlarged view of a region surrounded by broken lines B in FIG. 13A.

A semiconductor device 1 was prepared in accordance with the preferred embodiment described above. Here, a bare surface region 27 was formed on the facing end surface 22 of one island 2 of the two islands 2 and a plating film 17 was formed on the other facing end surface 22. The main constituent materials were as follows:
Islands 2 and leads 3: Cu alloy
Plating film 17: Ag plating film
Bonding material 32: Pb-3Sn-1Ag solder Comparative Example Besides forming plating films 17 on the facing end surfaces 22 of both islands 2 (no bare surface regions 27 at the facing end surfaces 22), a semiconductor device 1 was prepared in the same manner as in the example.
<Evaluation>
Photographs of interiors of the semiconductor devices obtained in the example and the comparative example are shown in FIG. 12A, FIG. 12B, FIG. 13A, and FIG. 13B. FIG. 12A and FIG. 12B are photographs of the comparative example, and FIG. 13A and FIG. 13B are photographs of the example.

As shown in FIG. 12A and FIG. 12B, in the comparative example, as a result of the plating films 17 being formed on the facing end surfaces 22, the bonding material 32 (solder) wet-spread to the facing end surfaces 22 and furthermore bridged across the adjacent islands 2.

On the other hand, as shown in FIG. 13A and FIG. 13B, in the example, although the bonding material 32 wet-spread to the facing end surface 22 on which the plating film 17 was formed, bridging across adjacent islands 2 was not seen. This is considered to be because the facing end surface 22 of one of the islands 2 was exposed as the bare surface region 27 and the bonding material 32 did not wet the bare surface region 27 constituted of the Cu alloy.

Figure 14A:
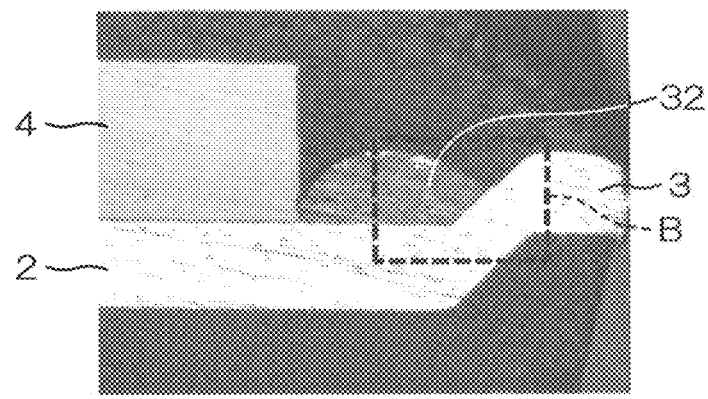
FIG. 14A is an image of a principal portion of a semiconductor device according to a reference example.
Figure 14B:
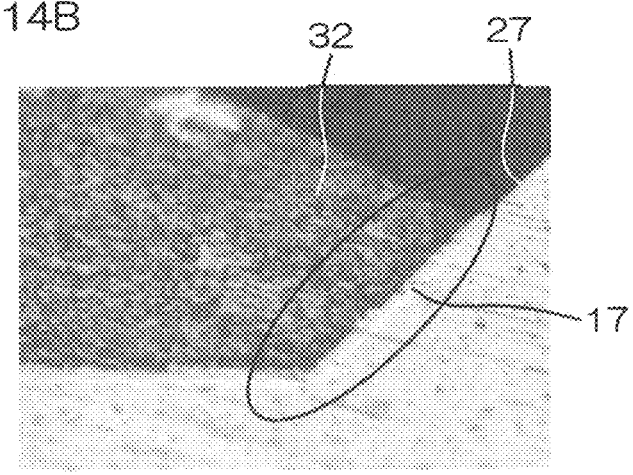
FIG. 14B is an enlarged view of a region surrounded by broken lines B in FIG. 14A.

Here, that the solder does not wet the Cu alloy can also be verified by a reference example of FIG. 14A and FIG. 14B. In FIG. 14B, a large amount of the bonding material 32 is retained in a recess demarcated by a chip 4, an island 2, and a lead 3 and although the bonding material 32 would normally be expected to wet-spread to an upper portion of the lead 3, the wet-spreading is actually stopped at a boundary between a plating film 17 and a bare surface region 27.

The presence/non-presence of a solder bridge in the example and the comparative example can also be seen in X-ray images shown in FIG. 15A, FIG. 15B, and FIG. 16. FIG. 15A is an X-ray image (plan view) of the semiconductor device according to the comparative example, and FIG. 15B is an X-ray image (side view) of the semiconductor device according to the comparative example. Also, FIG. 16 is an X-ray image (plan view) of the semiconductor device according to the example.

What is claimed is:
1. A semiconductor device comprising:
a plurality of islands, each having an outer surface including an upper surface and end surfaces;
semiconductor chips, above the respective islands;
a bonding material, between the respective islands and the respective semiconductor chips; and
plating layers, formed on portions of the outer surfaces of the plurality of islands; and
wherein the end surfaces of the plurality of islands include a first end surface facing an end surface of an adjacent island, and
the first end surface of at least one island among the plurality of islands is exposed as a bare surface region.
2. The semiconductor device according to claim 1, wherein on the upper surface of the at least one island, a first outer edge of the plating layer is set on a line separated by a predetermined distance from the first end surface, and
the bare surface region is further provided between the first end surface of the at least one island and the first outer edge of the plating layer.
3. The semiconductor device according to claim 2, wherein a distance between the first end surface of the at least one island and the first outer edge of the plating layer is 150 µm to 300 µm.
4. The semiconductor device according to claim 2, wherein each of the plurality of islands is formed to a quadrilateral shape in plan view that is demarcated by four of the end surfaces, and
the bare surface region at the upper surface of the at least one island includes a rectilinear portion of fixed width with respect to the first end surface of the at least one island and a non-rectilinear portion, continuous with at least one end portion in a length direction of the rectilinear portion and narrowing in width at a corner portion of the island.

5. The semiconductor device according to claim 4, wherein the non-rectilinear portion is demarcated by the first outer edge of the plating layer of arch shape that is curved toward an inner side of the at least one island.

6. The semiconductor device according to claim 1, further comprising:
   leads, disposed at peripheries of the respective islands and having a height difference with respect to the respective islands,
   wherein the end surfaces of the plurality of islands include a second end surface at a side at which the respective leads are disposed,
   on the upper surface of each island, a second outer edge of the plating layer is set on a line matching the second end surface, and
   a peripheral edge portion at a side of the second end surface of the upper surface of each island is covered by the plating layer.

7. The semiconductor device according to claim 6, wherein the second end surfaces of the plurality of islands are covered by the plating layers.

8. The semiconductor device according to claim 6, further comprising:
   second plating layers formed on outer surfaces of the leads.

9. The semiconductor device according to claim 1, further comprising:
   island support portions, connected integrally to third end surfaces differing from the first end surfaces of the islands and extending outward from the third end surfaces.

10. The semiconductor device according to claim 9, wherein the island support portions are provided at both of mutually adjacent islands and
   one of the island support portions and the other of the island support portions extend on the same straight line.

11. The semiconductor device according to claim 1, wherein a distance between the islands that are mutually adjacent is 100 μm to 200 μm.

12. The semiconductor device according to claim 1, wherein the plurality of islands are constituted of a metal material having Cu as a main component.

13. The semiconductor device according to claim 1, comprising: a resin package collectively sealing the plurality of islands and the plurality of semiconductor chips.

14. The semiconductor device according to claim 1, wherein, on the upper surfaces of the plurality of islands, the bonding material stays in regions inward of end edges of the respective upper surfaces.

15. The semiconductor device according to claim 1, wherein the bonding material includes protruding portions protruding outwardly from regions between the plurality of islands and the respective semiconductor chips.

* * * * *